(12) United States Patent
Chen et al.

(10) Patent No.: US 10,056,355 B2
(45) Date of Patent: Aug. 21, 2018

(54) COMMON-SOURCE PACKAGING STRUCTURE

(71) Applicant: TAIWAN SEMICONDUCTOR CO., LTD., New Taipei (TW)

(72) Inventors: Chien-Chung Chen, New Taipei (TW); Sen Mao, New Taipei (TW); Hsin-Liang Lin, New Taipei (TW)

(73) Assignee: Taiwan Semiconductor Co., Ltd., New Taipei (TW)

( * ) Notice: Subject to any disclaimer, the term of this patent is extended or adjusted under 35 U.S.C. 154(b) by 0 days.

(21) Appl. No.: 15/803,248

(22) Filed: Nov. 3, 2017

(65) Prior Publication Data

US 2018/0166423 A1 Jun. 14, 2018

Related U.S. Application Data

(62) Division of application No. 15/439,268, filed on Feb. 22, 2017.

(30) Foreign Application Priority Data

Dec. 14, 2016 (TW) .............................. 105141464 A

(51) Int. Cl.
*H01L 23/495* (2006.01)
*H01L 25/07* (2006.01)
(Continued)

(52) U.S. Cl.
CPC ........ *H01L 25/072* (2013.01); *H01L 23/3121* (2013.01); *H01L 24/06* (2013.01);
(Continued)

(58) Field of Classification Search
CPC ... H01L 25/072; H01L 23/3121; H01L 24/06; H01L 24/40; H01L 24/48;
(Continued)

(56) References Cited

U.S. PATENT DOCUMENTS 7,679,173 B2 * 3/2010 Uno .................. H01L 23/49524
257/177
7,994,577 B2 8/2011 Shih
(Continued)

*Primary Examiner* — Shahed Ahmed
(74) *Attorney, Agent, or Firm* — Muncy, Geissler, Olds & Lowe, P.C.

(57) ABSTRACT

A common-source type package structure is provided in the present invention. In the package structure, an integrated component body is configured a common-source pin region, a first arrangement region and a second arrangement region. The second and first arrangement regions are spaced apart from each other. A first MOSFET die and a second MOSFET are respectively located at the first and second arrangement region respectively, and have a top surface, a source electrode pad and a gate electrode pad. The source electrode pad and the gate electrode pad are exposed to the top surface and spaced apart from each other. A common-source connection element is connected to the source electrode pad and the common-source pin region. A gate connection element is connected to the gate electrode pad and a gate pin region of the integrated component body.

6 Claims, 5 Drawing Sheets

(51) Int. Cl.
*H01L 23/00* (2006.01)
*H01L 23/31* (2006.01)

(52) U.S. Cl.
CPC .............. *H01L 24/40* (2013.01); *H01L 24/48* (2013.01); *H01L 2224/40101* (2013.01); *H01L 2224/40137* (2013.01); *H01L 2224/48101* (2013.01); *H01L 2224/48137* (2013.01); *H01L 2924/13091* (2013.01)

(58) Field of Classification Search
CPC . H01L 2224/40101; H01L 2224/40137; H01L 2224/48101; H01L 2224/48137; H01L 2924/13091; H01L 23/49562; H01L 23/4951; H01L 23/49548; H01L 23/49568
USPC ............... 257/666, 672, 676, 788, 792, 793; 438/107, 112, 121, 127
See application file for complete search history.

(56) References Cited

U.S. PATENT DOCUMENTS

| | | | |
|---|---|---|---|
| 9,129,979 B2* | 9/2015 | Koike | H01L 21/565 |
| 2007/0272957 A1 | 11/2007 | Johnson | |
| 2009/0057852 A1 | 3/2009 | Madrid | |
| 2010/0308394 A1 | 12/2010 | Akil | |
| 2011/0227169 A1* | 9/2011 | Uno | H01L 25/165 |
| | | | 257/392 |

* cited by examiner

COMMON-SOURCE PACKAGING STRUCTURE

CROSS REFERENCE TO RELATED APPLICATIONS

This application is a Divisional of co-pending application Ser. No. 15/439,268, filed on Feb. 22, 2017, for which priority is claimed under 35 U.S.C. § 120; and this application claims priority of Application No. 105141464 filed in Taiwan on Dec. 14, 2016 under 35 U.S.C. § 119; the entire contents of all of which are hereby incorporated by reference.

BACKGROUND OF INVENTION

1. Field of the Invention

The present invention is related to a common-source packaging structure, and more particularly is related to a common-source packaging structure with two dies having the source electrode pads thereof electrically connected with each other.

2. Description of the Prior Art

Attending with technology development, widely use of electronic devices makes our daily lives more convenient. The power transistors, such as metal-oxide-semiconductor field-effect transistor (MOSFET), are commonly used in the electronic devices. With the advantages of high cell density and low static leakage current, the power transistors are widely used in the circuit design of electronic devices.

It has become a topic for the manufacturers to modify the design of semiconductor packaging structure for the power transistor to meet the trend of a smaller/slimmer semiconductor package. In the conventional packaging structure, if two or more MOSFET integrated circuits (ICs) connected with each other are needed, these MOSFET ICs would be separately packaged and the packaged ICs would be further connected with each other by using the conductive wires. The long conductive path would result in a greater conductive loss, and such design would occupy a significant footprint of the packaging substrate which may restrict the usage of a smaller packaging substrate.

In addition, the conventional packaging structure of the MOSFET IC only has one gate electrode pad arranged on the die. If the location of the die in the packaging structure needs to be changed, the circuit layout of the packaging structure should be modified accordingly. However, the location of the electrode pad may make the modification more difficult.

SUMMARY OF THE INVENTION

In view of the conventional technology mentioned above, which has the problems of a significant amount of conductive loss and the difficulty to reduce the size of packaging substrate, a common-source packaging structure is provided in the present invention, which packages the two dies in the same structure and has the source electrode pads of the dies electrically connected with each other so as to shorten the conductive path and reduce the size of the packaging structure as well as the packaging substrate.

Accordingly, it is a main object of the present invention to provide a common-source packaging structure, which comprises an IC unit and a packaging body. The IC unit includes a main body, a first metal-oxide-semiconductor field-effect transistor (MOSFET) die, a second MOSFET die, at least one common-source connection element, at least one first gate connection element, and at least one second gate connection element. The main body has a common-source region, a first gate region, a second gate region, a first arrangement region, and a second arrangement region, wherein the first arrangement region and the second arrangement region are separated from each other. The first MOSFET die is located on the first arrangement region, has a first upper layer, and comprises at least one first source electrode pad and at least one first gate electrode pad. The at least one first source electrode pad is exposed through the first upper layer, and the at least one first gate electrode pad is spaced apart from the at least one first source electrode pad and is exposed through the first upper layer.

The second MOSFET die is located on the second arrangement region, has a second upper layer, and comprises at least one second source electrode pad and at least one second gate electrode pad. The at least one second source electrode pad is exposed through the second upper layer, and the at least one second gate electrode pad is spaced apart from the at least one second source electrode pad and is exposed through the second upper layer. The at least one common-source connection element is connected to the at least one source electrode pad, the at least one second electrode pad, and the common-source region. The at least one first gate connection element is connected to the first gate electrode pad and the first gate region. The at least one second gate connection element is connected to the second gate electrode pad and the second gate region. The packaging body at least partially covers the IC unit.

In accordance with an embodiment of the present invention, the common-source region includes at least one first source pin and at least one second source pin, the first gate region includes at least one first gate pin, the second gate region includes at least one second gate pin, and the at least first one gate pin, the at least one source pin, the at least one second source pin, and the at least one second gate pin are arranged along a direction in a serial.

In accordance with an embodiment of the present invention, the at least one first source electrode pad includes at least one first notch, and the at least one first gate electrode pad is arranged close to the at least one first notch. In accordance with an embodiment of the present invention, the at least one second source electrode pad includes at least one second notch, and the at least one second gate electrode pad is arranged close to the at least one second notch. In addition, the at least common-source connection element is an one-piece metal clip, and the at least one first gate connection element and the at least one second gate connection element are at least one conductive wire respectively.

In accordance with an embodiment of the present invention, the at least one common-source connection element is at least one conductive wire.

By using the technology of the common-source packaging structure provided in accordance with the present invention, because the two MOSFET dies are integrated into one single packaging body featuring common-source design, conductive loss can be effectively reduced and size of the packaging substrate can be also effectively reduced.

In addition, by using the technology of the common-source packaging structure provided in accordance with the present invention, if two or more gate electrode pads are used, the gate electrode pads may be arranged at the corners of the MOSFET die so as to increase IC layout flexibility in practice.

BRIEF DESCRIPTION OF THE DRAWINGS

The present invention will now be specified with reference to its preferred embodiment illustrated in the drawings, in which.

DESCRIPTION OF THE PREFERRED EMBODIMENT

There are various embodiments of the common-source packaging structure provided in accordance with the present invention, which are not repeated hereby. Only three preferred embodiments are mentioned in the following paragraph as the example.

Figure 1:
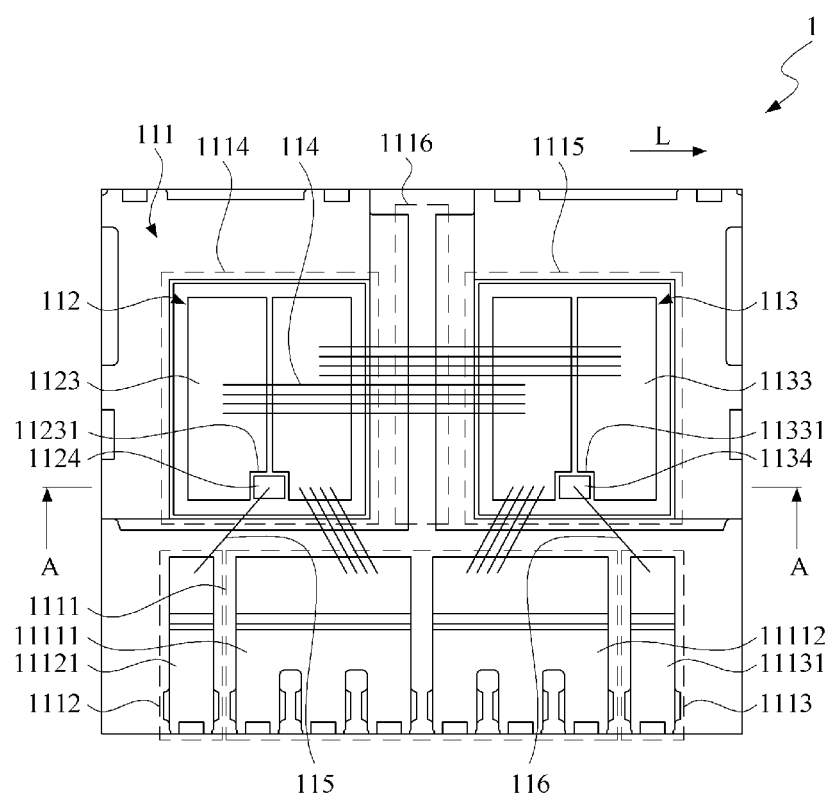
FIG. 1 is a top view of a common-source packaging structure provided in accordance with a first embodiment of the present invention.
Figure 2:
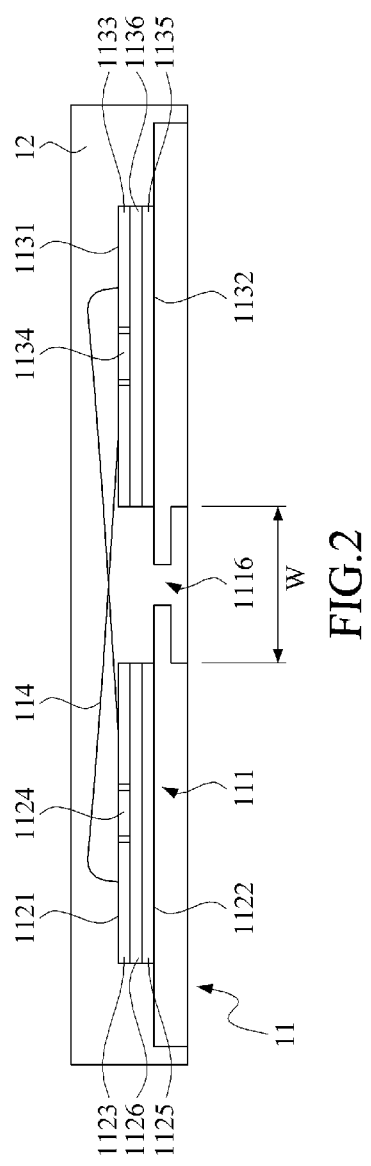
FIG. 2 is a cross-section view of the common-source packaging structure provided in accordance with the first embodiment of the present invention.

Please refer to FIG. 1 and FIG. 2, wherein FIG. 1 is a top view of a common-source packaging structure provided in accordance with a first embodiment of the present invention and FIG. 2 is a cross-section view of the common-source packaging structure provided in accordance with the first embodiment of the present invention.

As shown, a common-source packaging structure provided in accordance with the preferred embodiment of the present invention comprises an integrated circuit (IC) unit 11 and a packaging body 12. The IC unit 11 includes a main body 111, a first metal-oxide-semiconductor field-effect transistor (MOSFET) die 112, a second MOSFET die 113, at least one common-source connection element 114, at least one first gate connection element 115, and at least one second gate connection element 116.

The main body 111, such as a lead frame, has a common-source region 1111, a first gate region 1112, a second gate region 1113, a first arrangement region 1114, a second arrangement region 1115, and an isolation region 1116. The common-source region 1111 includes at least one first source pin 11111 (three pins are shown in the figure and one of them is labelled) and at least one second source pin 11112 (three pins are shown in the figure and one of them is labelled).

The first gate region 1112 includes at least one first gate pin 11121 (only one is shown in the figure), the second gate region 1113 includes at least one second gate pin 11131 (only one is shown in the figure). The at least first one gate pin 11121, the at least one source pin 11111, the at least one second source pin 11112, and the at least one second gate pin 11131 are arranged along a direction L in a serial so as to have the source pins and the gate pins showing the arrangement of bilateral symmetry. It would facilitate the research and development personnel to design the layout of the wires connected to the source electrode pad (the detail would be described in the following paragraphs).

The first arrangement region 1114 and the second arrangement region 1115 are opposite to each other through the isolation region 1116. That is, the first arrangement region 1114 and the second arrangement region 1115 are separated from each other. The isolation region 1116 may be filled with epoxy. A greater distance W of the isolation region 1116 may enhance the withstanding voltage (up to 600V for example), however, the present invention is not so restricted.

The first MOSFET die 112 is located on the first arrangement region 1114, has a first upper layer 1121 and a first lower layer 1122, and includes at least one first source electrode pad 1123 (two pads are shown in the figure, and one of them is labelled), at least one first gate electrode pad 1124, at least one drain electrode pad 1125, and at least one first semiconductor structure 1126.

The at least one first source electrode pad 1123 is exposed through the first upper layer 1121 and includes at least one first notch 11231 (only one is shown in the figure). The at least one first gate electrode pad 1124 is spaced apart from the at least one first source electrode pad 1123 and is exposed through the first upper layer 1121, and the at least one first gate electrode pad 1124 is arranged close to the at least one first notch 11231. In addition, the at least one first drain electrode pad 1125 is exposed through the first lower layer 1122. The first semiconductor structure 1126 is located between the first source electrode pad 1123 and the first drain electrode pad 1125. The first semiconductor structure 1126 is composed of the conventional circuit architecture, and thus is not repeated here.

The second MOSFET die 113 is located on the second arrangement region 1115, has a second upper layer 1131 and a second lower layer 1132, and includes at least one second source electrode pad 1133 (two electrode pads are shown in the figure, and one of them is labelled), at least one second gate electrode pad 1134, at least one second drain electrode pad 1135, and a second semiconductor structure 1136.

The at least one second source electrode pad 1133 is exposed through the second upper layer 1131 and includes at least one second notch 11331. The at least one second gate electrode pad 1134 is spaced apart from the at least one second source electrode pad 1133 and is exposed through the second upper layer 1131, and the at least one second gate electrode pad 1134 is arranged close to the at least one second notch 11331 (only one is shown in the figure). In addition, the at least one second drain electrode pad 1135 is exposed through the second lower layer 1132. The second semiconductor structure 1136 is located between the second source electrode pad 1133 and the second drain electrode pad 1135. The second semiconductor structure 1136 is composed of the conventional circuit architecture, and thus is not repeated here.

The at least one common-source connection element 114 (multiple connection elements are shown in the figure, and only one of them is labelled) is connected to the at least one first source electrode pad 1123, the at least one second source electrode pad 1133, and the at least one first source pin 11111 as well as the at least one second source pin 11112 of the common-source connection region 1111.

In accordance with the first embodiment of the present invention, the at least one common-source connection element 114 includes at least one conductive wire formed by using the wire bonding process, and a plurality of conductive wires are used in the first embodiment. It is noted that the common-source connection element 114 is used to connect the first source electrode pad 1123 and the second source electrode pad, the first source electrode pad 1123 and the at least one first source pin 11111, and the second source electrode pad 1133 and the at least one second source pin 11112, however, the present invention is not so restricted.

The at least one first gate connection element 115 is connected to the first gate electrode pad 1124 and the at least one first gate pin 11121 of the first gate region 1112, and the at least one first gate connection element 115 is a conductive wire.

The at least one second gate connection element 116 is connected to the second gate electrode pad 1134 and the at least one second gate pin 11131 of the second gate region 1113, and the at least one second gate connection element 116 is also a conductive wire, however, the present invention is not so restricted. The packaging body 12 at least partially covers the IC unit 11. The usage of the packaging body 12 is common to those skilled in the art and thus is not repeated here.

Figure 3:
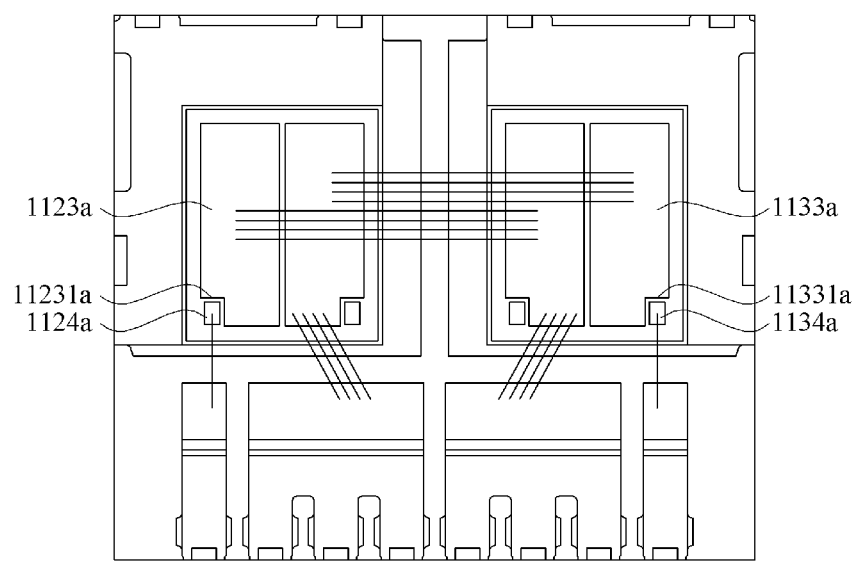
FIG. 3 is a top view of a common-source packaging structure provided in accordance with a second embodiment of the present invention.

Please refer to FIG. 3, which is a top view of a common-source packaging structure provided in accordance with a second embodiment of the present invention. As shown, in compared with the first embodiment, the first notches 11231a of the at least one first source electrode pad 1123a of the present embodiment (two first source electrode pads 1123a are shown and each of them includes one first notch 11231a, but only one is labelled) are located at the corresponding corners respectively (the notches may be located at the opposite edges or the asymmetrical positions in accordance with the other embodiments), and the two first gate electrode pads 1124a are located at the two first notches 11231a. The other portions are identical to the first embodiment, and thus are not repeated here.

In addition, the second notches 11331a of the at least one second source electrode pad 1133a of the present embodiment (two second source electrode pads 1133a are shown and each of them includes one second notch 11331a, but only one is labelled) are located at the corresponding corners respectively (the notches may be located at the opposite edges or the asymmetrical positions in accordance with the other embodiments), and the two second gate electrode pads 1134a are located at the two second notches 11331a. The other portions are identical to the first embodiment, and thus are not repeated here.

Figure 4:
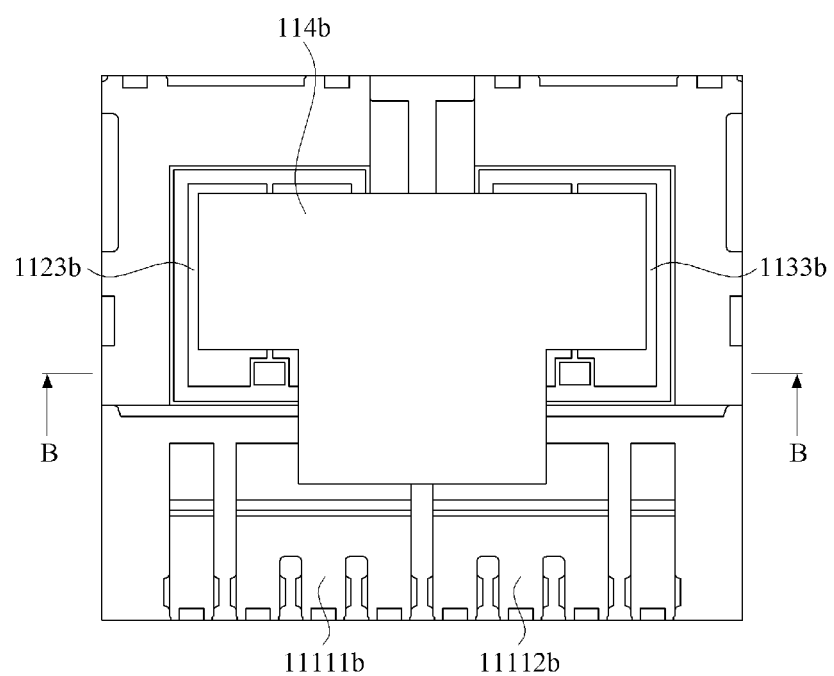
FIG. 4 is a top view of a common-source packaging structure provided in accordance with a third embodiment of the present invention.
Figure 5:
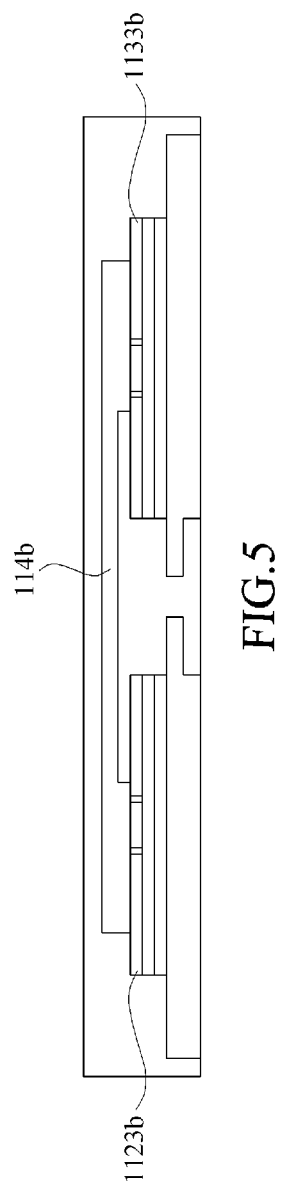
FIG. 5 is a cross-section view of the common-source packaging structure provided in accordance with the third embodiment of the present invention.

Please refer to FIG. 4 and FIG. 5, wherein FIG. 4 is a top view of a common-source packaging structure provided in accordance with a third embodiment of the present invention, and FIG. 5 is a cross-section view of the common-source packaging structure provided in accordance with the third embodiment of the present invention.

As shown, in compared with the first embodiment, the at least one common-source connection element 114b of the present embodiment is an one-piece metal clip, which contacts the first source electrode pad 1123b, the second source electrode pad 1133b, the at least one first source pin 11111b, and the at least one second source pin 11112b simultaneously. The other portions are identical to the first embodiment and thus are not repeated here.

In sum, by using the technology of the common-source packaging structure provided in accordance with the present invention, because the two MOSFET dies are packaged into one single packaging body featuring common-source design, conductive loss can be effectively reduced and size of the packaging substrate can also be effectively reduced. In addition, if two or more gate electrode pads are used, the gate electrode pads may be arranged at the corners of the MOSFET die so as to increase IC layout flexibility in practice.

While the present invention has been particularly shown and described with reference to a preferred embodiment, it will be understood by those skilled in the art that various changes in form and detail may be without departing from the spirit and scope of the present invention.

What is claimed is:

1. A common-source packaging structure, comprising:
an integrated circuit (IC) unit, comprising:
a main body, having a common-source region, a first gate region, a second gate region, a first arrangement region, and a second arrangement region, wherein the first arrangement region and the second arrangement region are separated from each other;
a first metal-oxide-semiconductor field-effect transistor (MOSFET) die, located on the first arrangement region, having a first upper layer, and comprising:
at least one first source electrode pad, exposed through the first upper layer; and
two first gate electrode pads, respectively located at two corresponding corners of the at least one first source electrode pad, spaced apart from the at least one first source electrode pad, and exposed through the first upper layer;
a second MOSFET die, located on the second arrangement region, having a second upper layer, and comprising:
at least one second source electrode pad, exposed through the second upper layer; and
two second gate electrode pads, respectively located at two corresponding corners of the at least one second source electrode pad, spaced apart from the at least one first source electrode pad, spaced apart from the at least one second source electrode pad, and exposed through the second upper layer;
at least one common-source connection element, connected to the at least one first source electrode pad, the at least one second source electrode pad, and the common-source region;
a first gate connection element, connected to one of the first gate electrode pads and the first gate region;
a second gate connection element, connected to one of the second gate electrode pads and the second gate region; and
a packaging body, at least partially covering the IC unit.

2. The common-source packaging structure of claim 1, wherein the common-source region includes at least one first source pin and at least one second source pin, the first gate region includes at least one first gate pin, the second gate region includes at least one second gate pin, and the at least first one gate pin, the at least one source pin, the at least one second source pin, and the at least one second gate pin are arranged along a direction in a serial.

3. The common-source packaging structure of claim 1, wherein the at least one first source electrode pad includes two first notches respectively formed at the two corresponding corners of the at least one first source electrode pad, and the first gate electrode pads are arranged close to the first notches respectively.

4. The common-source packaging structure of claim 1, wherein the at least one second source electrode pad includes two second notches respectively formed at the two corresponding corners of the at least one second source electrode pad, and the second gate electrode pads are arranged close to the second notches respectively.

5. The common-source packaging structure of claim 1, wherein the at least one common-source connection element is at least one conductive wire.

6. The common-source packaging structure of claim 1, wherein the first gate connection element and the second gate connection element are conductive wires respectively.

* * * * *